(12) United States Patent
Thurén et al.

(10) Patent No.: US 7,167,231 B2
(45) Date of Patent: Jan. 23, 2007

(54) METHOD AND APPARATUS FOR PRINTING LARGE DATA FLOWS

(75) Inventors: Anders Thurén, Täby (SE); Karel Van Der Mast, Helmond (NL); Arno Bleeker, Westerhoven (NL)

(73) Assignee: Micronic Laser Systems AB, Taby (SE)

( * ) Notice: Subject to any disclaimer, the term of this patent is extended or adjusted under 35 U.S.C. 154(b) by 0 days.

(21) Appl. No.: 10/508,463

(22) PCT Filed: Mar. 19, 2003

(86) PCT No.: PCT/SE03/00462

§ 371 (c)(1),
(2), (4) Date: Jul. 14, 2005

(87) PCT Pub. No.: WO03/081338

PCT Pub. Date: Oct. 2, 2003

(65) Prior Publication Data

US 2006/0055903 A1 Mar. 16, 2006

(30) Foreign Application Priority Data

Mar. 21, 2002 (SE) .................................. 0200864

(51) Int. Cl.
- G03B 27/42 (2006.01)
- G21K 5/10 (2006.01)
- B41J 2/455 (2006.01)

(52) U.S. Cl. .................... 355/53; 250/492.22; 347/233
(58) Field of Classification Search ............... 355/53; 250/492.22; 347/233, 239, 255; 358/1.9
See application file for complete search history.

(56) References Cited

U.S. PATENT DOCUMENTS 5,533,170 A * 7/1996 Teitzel et al. ................ 358/1.8
6,285,488 B1 * 9/2001 Sandstrom .................. 359/290
6,717,097 B1 * 4/2004 Sandstrom et al. ...... 219/121.6

FOREIGN PATENT DOCUMENTS

WO  WO 01/18606 A1 *  3/2001

* cited by examiner

*Primary Examiner*—Alan Mathews
(74) *Attorney, Agent, or Firm*—Ernest J. Beffel, Jr.; Haynes Beffel & Wolfeld LLP

(57) ABSTRACT

An aspect of the present invention includes a method for patterning a workpiece covered at least partly with a layer sensitive to electromagnetic radiation, comprising the actions of, providing a data representation of at least one image to be imaged onto a plurality of locations of said workpiece, fracturing said data representation into a plurality of field stripes, repeating the actions of rasterizing a first field stripe of said data representation, modulating a modulator according to said rasterized field stripe, imaging said first field stripe onto a plurality of locations of said workpiece, rasterizing a second field stripe of said data representation while imaging said first field stripe onto said plurality of locations of said workpiece, terminating the repetition when a predetermined amount of said image is imaged onto said plurality of locations of said workpiece. Other aspects of the present invention are reflected in the detailed description, figures and claims.

18 Claims, 7 Drawing Sheets

METHOD AND APPARATUS FOR PRINTING LARGE DATA FLOWS

PRIORITY DATA

This application is the National Stage of International Application No. PCT/SE03/00462, filed 19 Mar. 2003; which application claims the benefit of Swedish Application No. 0200864-7, filed 21 Mar. 2002.

TECHNICAL FIELD

The present invention relates to a method for patterning a workpiece, in particular it relates to a direct-writing lithographic method for forming a desired pattern on a workpiece, such as a mask substrate or an integrated circuit substrate.

BACKGROUND OF THE INVENTION

In the past, integrated circuits have been manufactured more or less solely by using a number of masks or reticles comprising a pattern of a layer in said integrated circuit. In today's integrated circuits the number of layers could be larger than 30. Said Masks or reticles may be prepared in lithographical manner by using for example electron beams or laser beams for exposing a layer of material sensitive for the type of beam chosen. The mask material is most commonly transmissive on top of one of its sides a thin layer of opaque material is attached. In said thin material the pattern of one layer of said integrated circuit is created. The mask has typically N times larger pattern than the pattern to be printed on the semiconducting substrate for forming said integrated circuit. The reduction in size is performed in a stepper, which uses the mask(s) for forming said integrated circuit.

More recently, the need to manufacture integrated circuits by means other than using a conventional mask has developed for a number of reasons, for example the price of manufacturing mask(s) has increased due to its complexity to manufacture, small-scale development which needs very small series of integrated circuits, etc.

Unfortunately, all of the present known techniques for forming integrated circuits without using conventional masks or reticles have drawbacks and limitations.

For example, most direct-writers known in the art are based on electron beams, typically so called shaped beams, where the pattern is assembled from flashes, each defining a simple geometrical figure. Other systems are known which use raster scanning of Gaussian beams. By using a conventional mask writer, which uses beams of electrons or laser beams for forming the pattern on a workpiece, is limited to relatively low scanning speeds, and, perhaps worst of all, can only scan a single dimension.

SLM writers disclosed in other patent applications, such as WO 01/18606 and U.S. patent application Ser. No. 09/954,721 by one of the assignees of the present invention and hereby incorporated by reference is related to raster scanning in the sense that it permits a bitmap pattern, but distinct by printing an entire frame of pattern in one flash instead of building the pattern from individual pixels.

A spatial light modulator (SLM) comprises a number of modulator elements, which can be set in a desired way for forming a desired pattern. Reflective SLMs may be exposed to any kind of electromagnetic radiation, for example DUV or EUV for forming the desired pattern on the mask.

A direct-writing pattern generator for writing certain layers in a semiconductor design directly from data would have a high value to the industry. However, the complexity of modern chips is extremely high and getting higher by every new technology generation. The direct-writer must write the complex pattern not one, but 100 times on a 300 mm wafer.

FIG. 1 depicts in simplified form a representation for a prior art direct writer that writes one chip 110 at a time with a particle beam 120.

FIG. 2a illustrates a representation of a conceived direct-writing system 200 with multiple e-beam columns 250, a pattern store 240, a rasterizing unit 230, a memory unit 220 and column buffers 210. FIGS. 1 and 2a are from material presented by Mark Gesley of ETEC Systems at the ISMT/SRC Maskless Lithography Workshop 2002 in August the same year. The presentation describes a conceived multiple micro-column e-beam system using a raster scan gray-scale principle. The micro-columns form a regular array with from 5×5 to 20×20 mm separation. The array covers a substantial part of the wafer's area and the stage is scanning only to fill the 5×5 mm (etc.) area. Over scanning into the next micro-column space can be used for redundancy. It is however unclear from the presentation how the information is presented internally. The image of the multiple micro-columns indicates that the same data is sent to each micro-column and the number of field is equal to the number of columns.

Researchers at UC Berkeley have explored another aspect of handling large data flows. One item to be handled by a direct-writer is the loading of data onto the transducers, here a micro-mechanical SLM. By compressing the pattern strongly it is possible to store on hard disks and decompress in several cascaded steps at the time of writing. FIG. 2b is an illustration of a parallel architecture according to UC Berkeley for handling large data flows. At least one step of decompression is done on the SLM chip. By this method both storage and transmission issues are thought to be solved.

Modern microelectronic designs are so complex that the sheer storage and transmission of the design files becomes a problem. When the design is flattened out, i.e., when its hierarchy is resolved, the data volume expands and finally the volume expands beyond all practical storage option when it is converted into bitmap. From a design file of typically 10–100 G bytes a bitmap volume of 1000 Tbyte is produced for a wafer. The figures are only an indication of the orders of magnitude and will of course change by wafer size and technology node. Only compression is not going to solve the bandwidth issues of the data flow, since data has to be processed and modified during conversion to bitmap data. An example is that overlap has to be removed and process bias added after the removal of the overlap.

What is needed is a method and apparatus, which creates pattern on a workpiece essentially faster than the prior art techniques and is capable to handle the large data flows necessary.

SUMMARY OF THE INVENTION

Accordingly, it is an object of the present invention to provide a method of patterning a workpiece, which overcomes or at least reduces the above-mentioned problem of time consuming manufacturing times due to large data flows.

This object, among others, is according to a first aspect of the invention attained by a method for patterning a workpiece covered at least partly with a layer sensitive to electromagnetic radiation, comprising the actions of providing a data representation of at least one image to be imaged onto a plurality of locations of said workpiece, fracturing said data representation into a plurality of field stripes, repeating the actions of, rasterizing a first field stripe of said data representation, modulating a modulator according to said rasterized field stripe, imaging said first field stripe onto a plurality of locations of said workpiece, rasterizing a second field stripe of said data representation while imaging said first field stripe onto said plurality of locations of said workpiece, terminating the repetition when a predetermined amount of said image is imaged onto said plurality of locations of said workpiece.

In another embodiment according to the invention, said field stripes belonging to two consecutive strokes are non adjacent to each other.

In another embodiment of the invention, said field stripes belonging to two consecutive strokes are adjacent to each other.

In another embodiment according to the invention, said image is imaged onto the workpiece by means of an SLM illuminated by said electromagnetic radiation.

In another embodiment according to the invention, said workpiece is a wafer.

In another embodiment according to the invention, said image represents an integrated circuit.

In another embodiment according to the invention, field stripes belonging to two consecutive strokes are imaged in opposing directions onto the workpiece.

Another aspect of the present invention relates to a method for patterning a workpiece covered at least partly with a layer sensitive to electromagnetic radiation, comprising the actions of providing a data representation of at least one image to be imaged onto a plurality of locations of said workpiece, fracturing said data representation into a plurality of field stripes, repeating the actions of rasterizing a first field stripe of said data representation, modulating a modulator according to said rasterized field stripe, imaging said first field stripe onto a plurality of locations of said workpiece, rasterizing a second field stripe of said data representation while imaging said first field stripe onto said plurality of locations of said workpiece, terminating the repetition when a predetermined number of said images have been imaged onto said plurality of locations of said workpiece.

In another embodiment according to the present invention, said field stripes belonging to two consecutive strokes are non adjacent to each other.

In another embodiment according to the present invention, said field stripes belonging to two consecutive strokes are adjacent to each other.

In another embodiment according to the present invention, said image is imaged onto the workpiece by means of an SLM illuminated by said electromagnetic radiation.

In another embodiment according to the present invention, said workpiece is a wafer.

In another embodiment according to the present invention, said image represents an integrated circuit.

In another embodiment according to the present invention, field stripes belonging to two consecutive strokes are imaged in opposing directions onto the workpiece.

The invention also relates to an apparatus for patterning a workpiece, comprising a memory for storing a data representation of at least one image to be written on said workpiece, a fracturing device to fracture said data representation into a plurality of field stripes, a rasterizing device to rasterize said field stripes, at least two buffer memories to buffer rasterized field stripes, a buffer write control to control into which buffer memory to write the rasterized data, a buffer read control to control from which buffer memory to read rasterized data to be imaged onto the workpiece, a scheduler to schedule which field stripe to rasterize, when to buffer rasterized data and when to read data to be imaged onto the workpiece, and a modulator capable to modulate a beam of electromagnetic radiation according to said rasterized data to be imaged onto a plurality of locations of said workpiece, wherein said apparatus is capable to rasterize a field stripe while imaging another field stripe onto said workpiece.

In another embodiment according to the present invention, said workpiece is a wafer.

In another embodiment according to the present invention, said image represents an integrated circuit.

In another embodiment according to the present invention, said image is imaged onto the workpiece by means of an SLM illuminated by said electromagnetic radiation.

Further characteristics of the invention, and advantages thereof, will be evident from the detailed description of preferred embodiments of the present invention given hereinafter and the accompanying FIGS. 1–8, which are given by way of illustration only, and thus are not limitative of the present invention.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Further, the preferred embodiment are described with reference to an SLM. It will be obvious to one ordinary skill in the art that actuators other than SLMs will be equally applicable; examples are 2-dim modulator comprising an array of acoustooptic driven transducers, 2-dim array of actuators being transmissive, for example of LCD type, or similar 2-dim modulating devices.

The invention relates to direct-writing of a workpiece, such as a semiconductor wafer or a mask substrate. Using any kind of radiation, i.e., light from IR to EUV, x-ray or particle beams such as electron, ion or atom beams may perform the direct-writing.

The method of the invention off-loads a data path the repetition of processing the same data over and over again for identical chips. This is done at the expense of increased mechanical overhead. One of the preferred embodiments devices a structure where said increased mechanical overhead is absorbed without a throughput penalty. The combination of pattern buffering and a state-of-the-art wafer-scanner stage reduces the data processing by the number of identical fields in a row or on a wafer. For each type of field on the wafer, typically only one, the data is rendered into bitmap only once. Furthermore, there is a built-in repeat function in each field so that identical chips inside a field need only be rasterized once.

Figure 3:
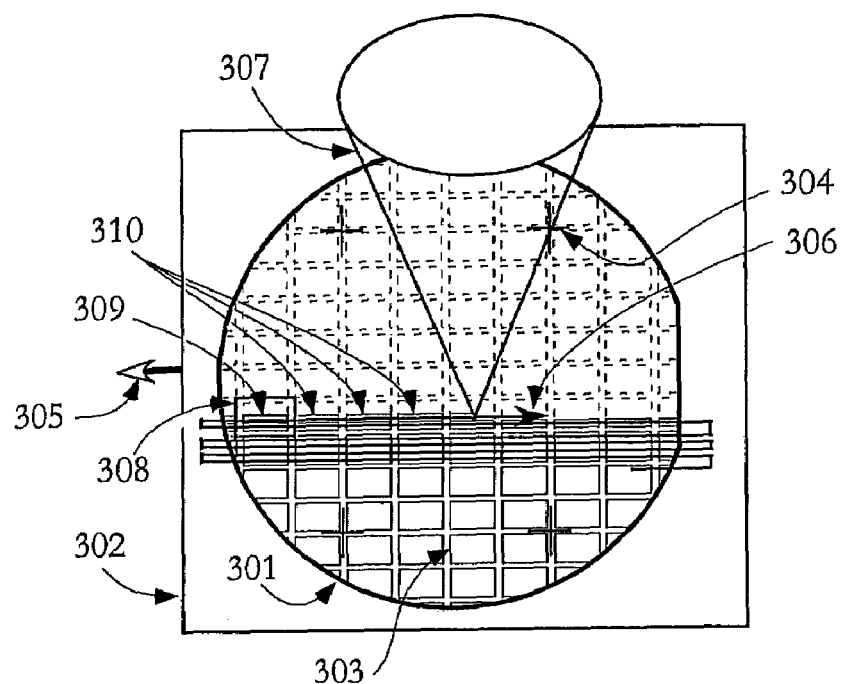
FIG. 3 depicts an embodiment according to the present invention for forming a pattern on a workpiece.

FIG. 3 shows a wafer 301 on a scanning stage 302 under a stationary writing beam, image forming optics or equivalent writing mechanism 307. The movement 305 of the stage 302 is continuous in strokes 306, each stroke writes a stripe across the wafer. Said wafer comprises a number of already prepared chips 303. The area 308, corresponding to a reticle in a stepper, is fractured and rasterized and the data is buffered and reused for several, or all, field along the stripe. The area 308 is described in the input data by a "soft reticle", a data set that is closely related to mask file that would be used for producing a real physical reticle for printing the same field. This will be described later in more detail.

The area that is buffered is a so called field-stripe 309, being the intersecting area between the soft reticle 308 and the stripe, including any stripe overlap needed for the writing and for the data path processing.

Figure 6:
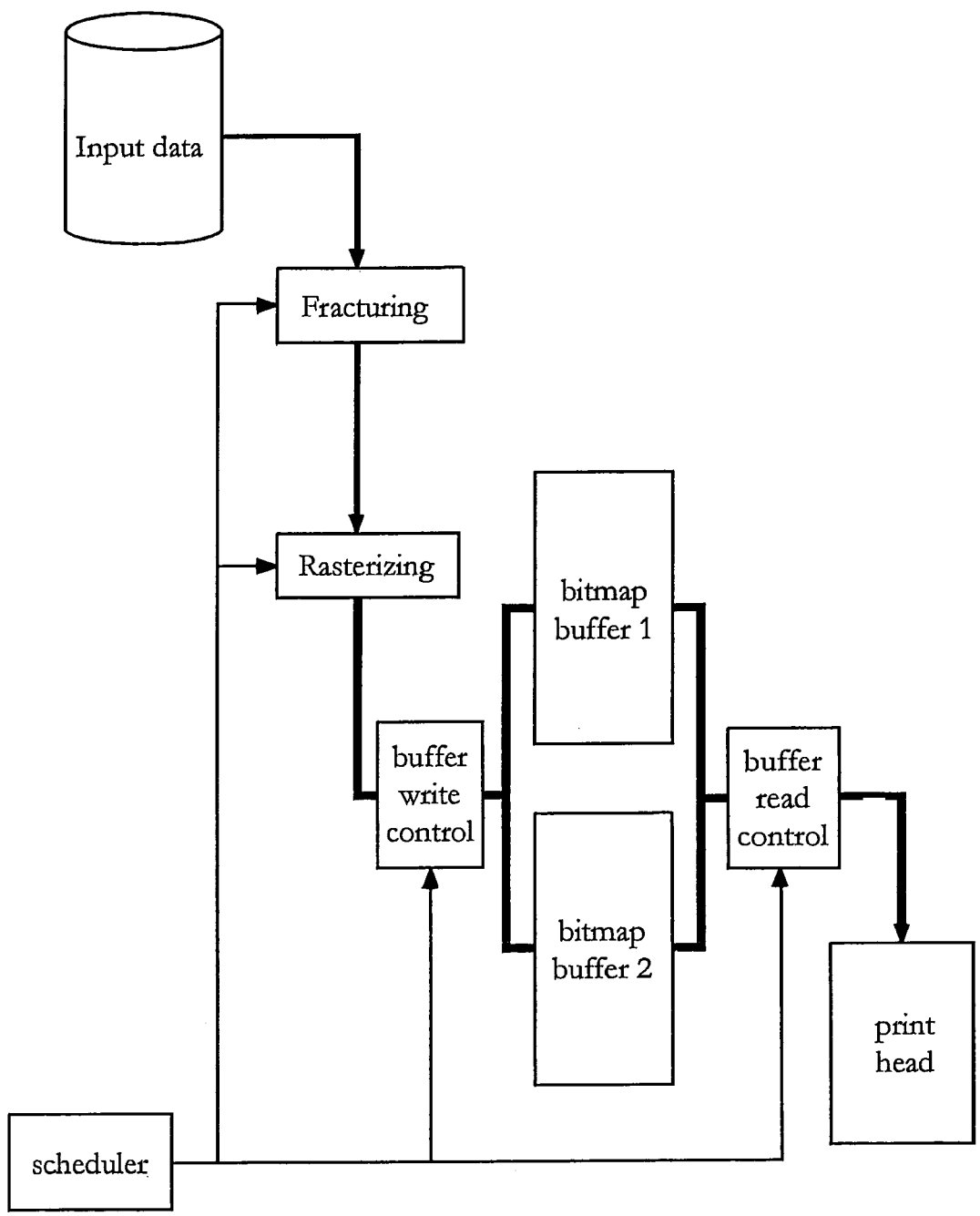
FIG. 6 illustrates schematically an implementation of the inventive method according to FIG. 3 and FIG. 4.

The machine starts to write one stripe, taking data from a field-stripe bitmap buffer, as soon as the stage and data are ready. Field-stripes are generated in the fracturing step depicted in FIG. 6. While it is performing the writing of the stroke a second buffer is loaded by bitmap data produced by the rasterizer. An embodiment is shown in FIG. 6. The soft-reticle data is residing in mass storage, typically hard disks. A scheduler reads the job definition file describing the number of fields to be printed, their location, etc. and produces control sequences for the data path and the stage control. The scheduler directs the fracture unit to fetch the right data and preprocesses it for rasterizing. The data is transferred to the rasterizer, employing suitable buffering.

Figure 4:
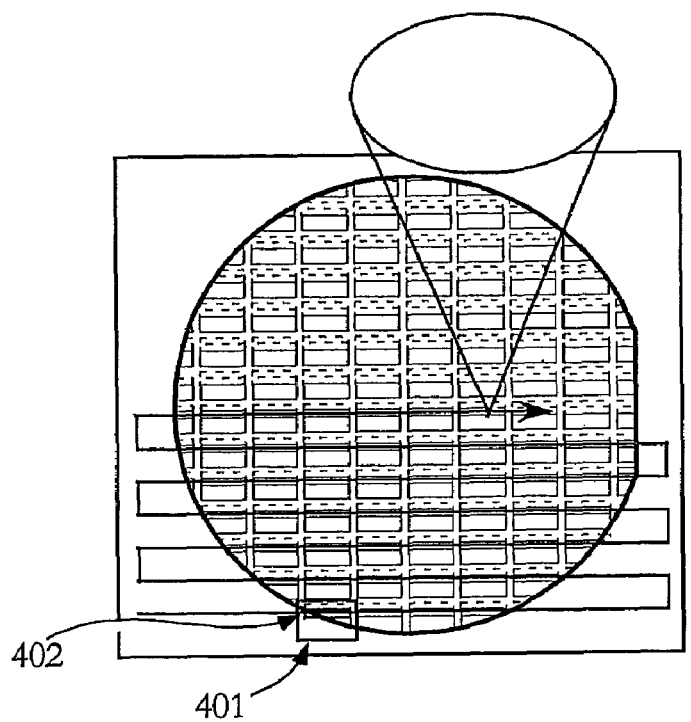
FIG. 4 depicts another embodiment according to the present invention for forming a pattern on a workpiece.
Figure 5:
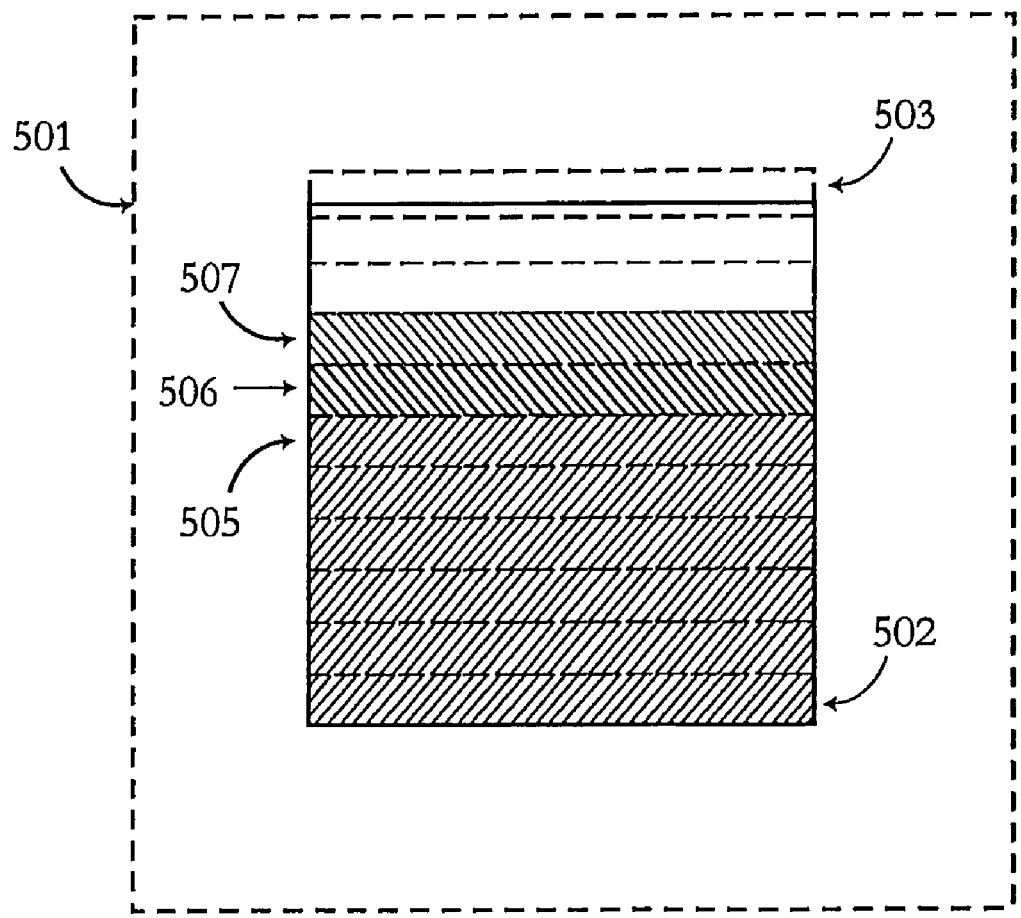
FIG. 5 depicts a soft reticle and its division into chip stripes.

FIG. 5, showing a soft reticle where the dashed frame 501 indicates the quartz substrate if it had been a physical reticle, can further exemplify the sequence. The pattern area 502 is divided into field-stripes 503, optionally overlapping. At a certain moment during the writing of a wafer a number of the stripes have been written already 506. One field-stripe exists as bitmap data in bitmap buffer 1, see FIG. 6. The next field-stripe in the sequence, not necessarily by adjacency, is being rasterized into bitmap buffer 2. The scheduler and the buffer write control in FIG. 6 directs the rasterized data to the write buffer while the buffer read control directs data from the other buffer to the print head. The buffer read control has another function as well: it reads the buffered data forward or backwards depending on the direction of the stripe in FIGS. 3 and 4.

Any practitioner in the field will be able to devise alternative hardware structures for FIG. 6. The structure with two separate buffer areas is reasonable since the buffer size for field-stripe is known beforehand and, given a maximum field size, will have a constant maximum value. But an alternative with a contiguous memory and dynamic allocation of memory is equally useful and may, depending on the detailed requirements in a particular system type, be preferable. Using more than two physical memory areas may also be useful, for example as a way of interfacing more than one rasterizing units to one print-head.

FIG. 4 shows another embodiment with a very fast and accurate stage where the time to step from one row of fields to the next row, and settle there within the required placement accuracy, so that it does not cause any practical slowing down of the system. The ATLAS stage used in ASML's state-of-the-art scanners has a maximum speed 500 mm per seconds, an acceleration of 12 m/s$^2$ and a stepping time from one row to the next of less than 0.2 seconds. Even at the highest stage speed, 500 mm/s, with a time of writing a stripe across a 300 mm wafer being 0.6 seconds the mechanical overhead is 25% percent of the total time or less.

Figure 1:
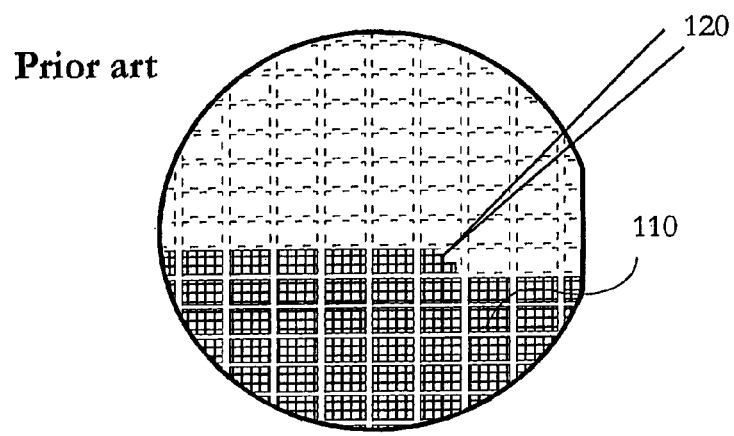
FIG. 1 depicts a prior art method of patterning a wafer.
Figure 2A:
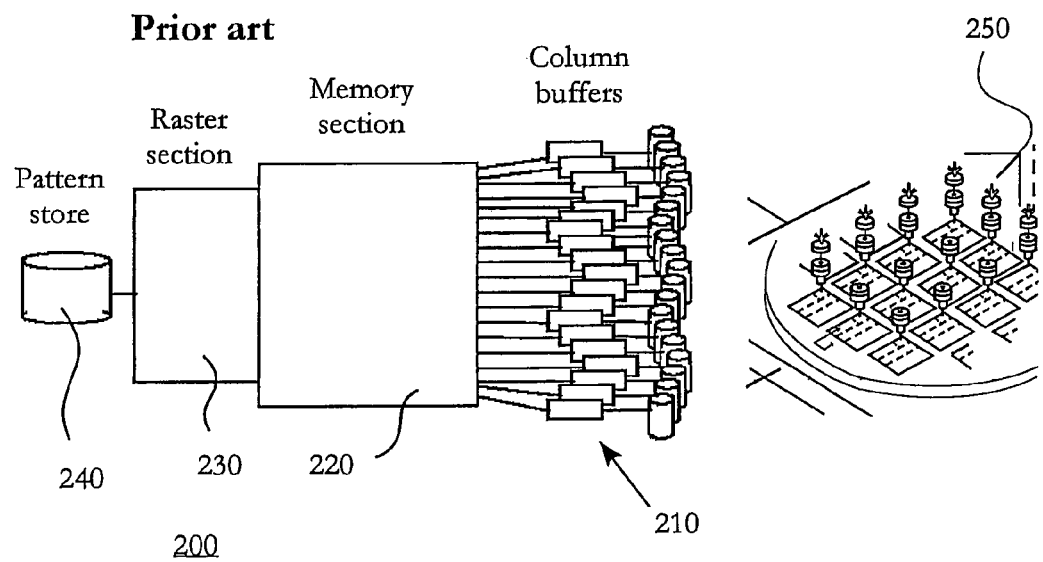
FIG. 2a depicts a conceptual prior art data path for a direct-writer with an array of micro-columns.
Figure 2B:
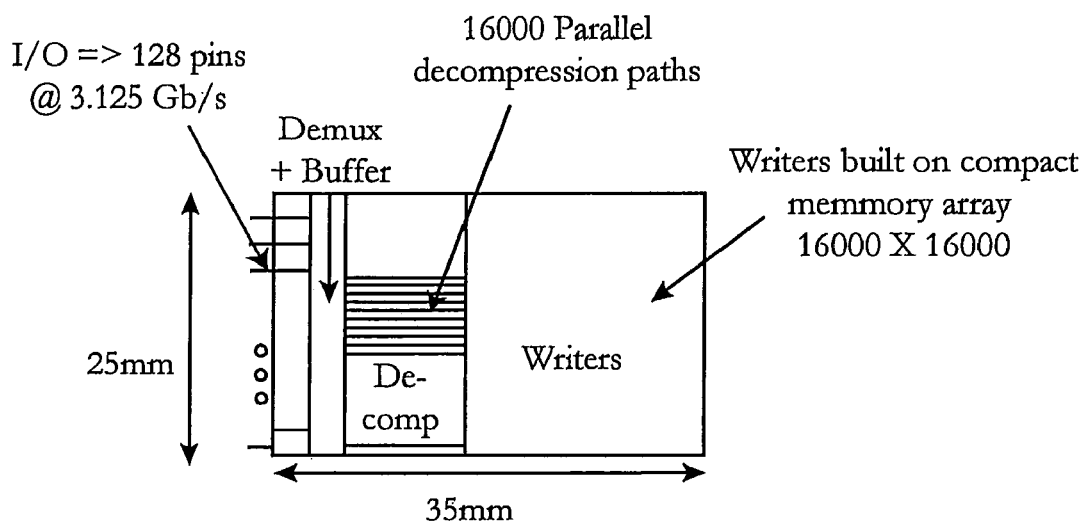
FIG. 2b illustrates a conceptual prior art data compression circuit that allows a direct-writer to write from off-line prepared data stored on hard disks.

More important is that the stepping time is shorter than the time it takes to change direction of the scanning motion. Therefore the mechanical overhead is essentially the same for the schemes in FIG. 3 and FIG. 4. It rasterizes the soft reticle 401 only once for the entire wafer, since it writes all occurrences of a field-stripe 402 on the wafer in one go. Since the number of field in a 300 mm wafer is approximately 100 the reduction in data processing volume compared to FIG. 1 is also a factor 100.

In the preferred embodiment the wafer is written after global alignment using alignment marks 304 already placed on the wafer in a previous patterning step. The marks, four are shown but there can be any number from 2 and upwards and it is also possible to use the printed patterns within the chips to align to, are measured and an optionally non-linear coordinate system for the wafer is computed. Alternatively, a distortion file is read in, created beforehand from measurements or distortion predictions based on a variety of factors, pattern density, previous layer distortion, etc. If a separate distortion map is used it is combined with the measurement of the alignment marks and a coordinate system for the wafer is created. The writing of the wafer is then made with this coordinate system as reference.

Likewise a height map of the wafer is measured before the writing begins and the focusing of the print head is done by dead count based on the height map.

Figure 7:
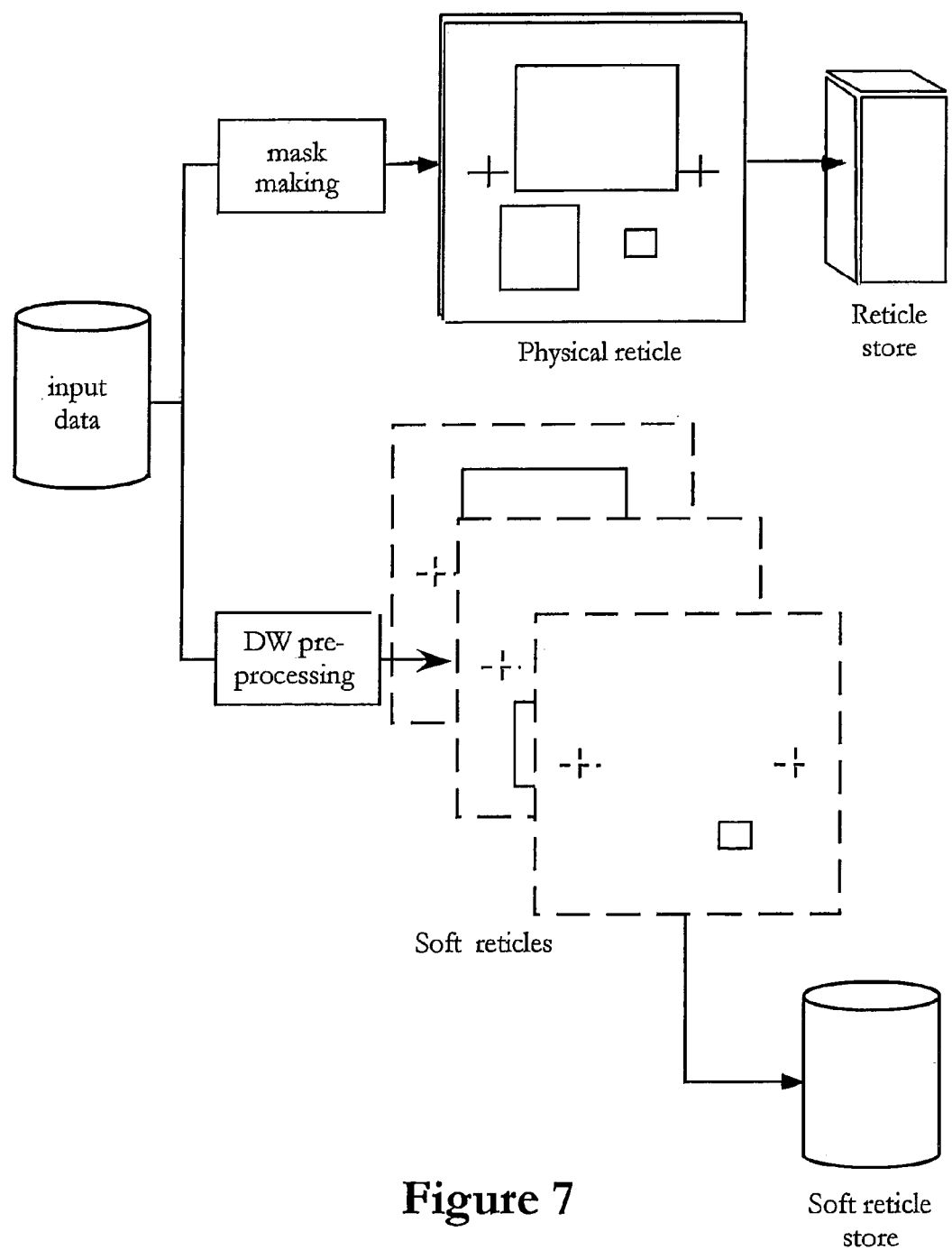
FIG. 7 illustrates how a reticle design is used to create a physical reticle and/or one or several soft reticles.

FIG. 7 shows how physical and soft reticles are produced from the same mask pattern file. The physical may have several images (pattern areas that are masked by rulers in the stepper and used separately), alignment marks, bar codes, mask process test structures etc. The soft reticle has a pattern area and optional digital information describing the position of the alignment marks and their type. It is useful to define a soft reticle data structure that allows one soft reticle to include several soft reticles each of which has one pattern file. The so-defined reticle format is closely analog to the physical reticle having several images.

FIG. 7 shows the similarity between soft and hard (physical) reticles when they are created, and a corresponding similarity exists when they are used. Drawn to the extreme this would mean that the same data file is used for creating them and the same job file is used on the stepper-scanner and on the direct-writer to use them. The job file has a principle code like this

```
Start job,
measure height map,
align wafer to alignment marks,
call reticle #34567, image #1,
set dose 100%,
set focus-130 nm,
expose fields:
```

-continued

```
        xxxx.xxxx1 yyyy.yyyy1
        xxxx.xxxx2 yyyy.yyyy2
        xxxx.xxxx3 yyyy.yyyy3
        xxxx.xxxx4 yyyy.yyyy4
        ...
    call reticle #34567, image #2
        xxxx.xxxx103 yyyy.yyyy103
        xxxx.xxxx104 yyyy.yyyy104
    end job
```

Figure 8:
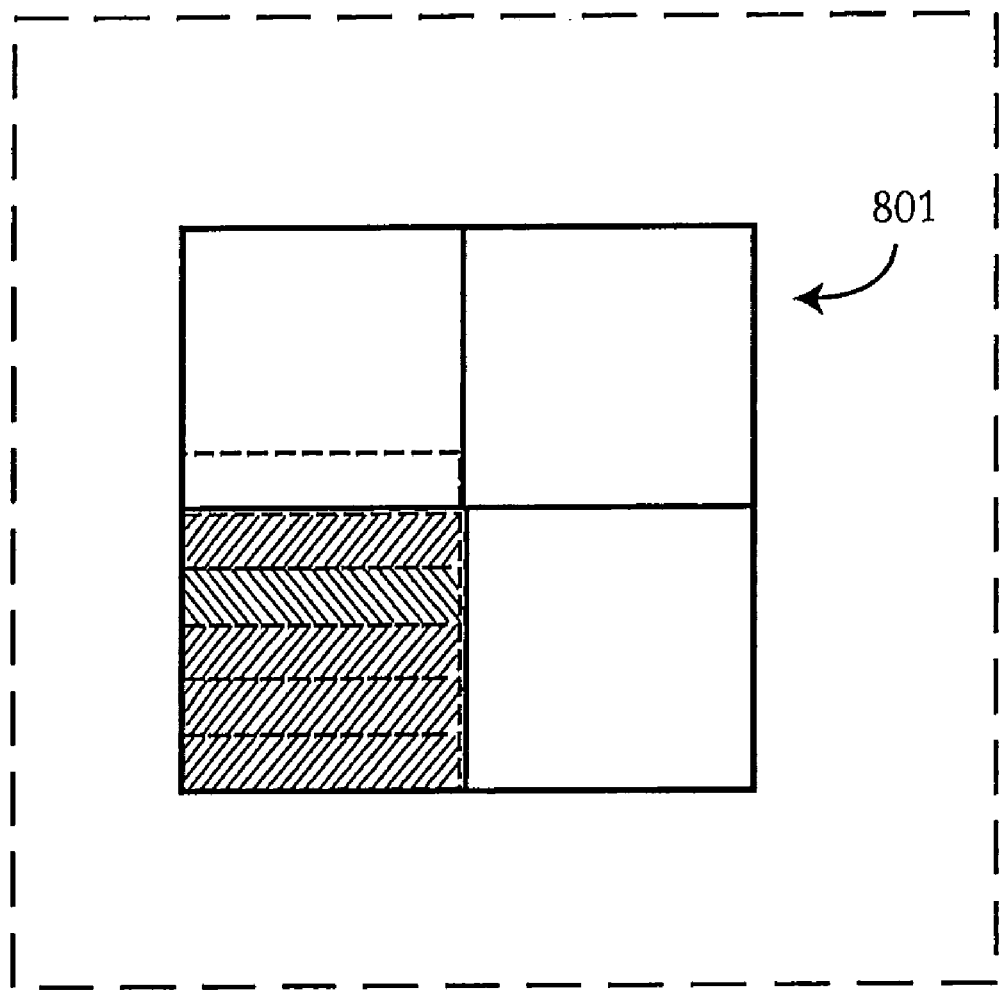
FIG. 8 shows a soft-reticle with a repeating chip where only one instance need to be rasterized.

The stepper calls the reticle from the reticle storage, while the direct writer fetches if from digital storage. In practice the soft reticles may need to be adapted to the direct writer, something that is indicated by the box "DW pre-processing" in FIG. 7. One example is shown in FIG. 8 where the mask pattern has four identical chips. Only one of them need to be rasterized and the job file can be modified to create the other three parts by repetition of a smaller soft reticle.

A preferred embodiment is a direct writer for 300 mm wafers based on the SLM principle described in U.S. Pat. No. 6,285,488 assigned to one of the applicants of the present application and incorporated herein by reference and using 193 nm radiation. It has 4 SLMs, each with 2048×4096 mirrors. The projection optics reduces each mirror to a pixel 40 nm in square on the silicon. Two print 5 wafers per hour including overhead the flash rate has to be 4 kHz. Each pixel has 65 gray values and is allotted a byte of data. The data rate is then 4×4000×2048×4096=134 Gbyte/s. The stage speed is 320 mm/s during the writing stroke and a stroke takes 1 second across a 300 mm wafer. The soft reticle size is limited to 38 mm along the stripe and the buffer size is 16 Gbytes. The system has an ATLAS stage as described above and the mechanical overhead per stripe is 17%. Assume a typical pattern of 16×32 mm. The actual buffered data volume is 14 Gb and there are 19 rows of fields on the wafer. Therefore it takes 19×(1+0.2)=23 seconds to write all fields on the wafer in one pass. During those 23 seconds the next buffer has to be rasterized, which gives the rasterizing capacity 14/23=0.6 Gbyte/s. The rasterizer has been described in U.S. patent application Ser. No. 09/954,721 and is running inside the Micronic SIGMA mask writer in development.

If more than one field is printed on the same wafer the needed rasterizing capacity goes up in proportion: 2 different fields require 1.6 Gbyte/s, 4 fields require 2.4 Gbytes/s. However, the rasterizer and fracturing module is dimensioned after very complex patterns and with typical design files it may well be possible to write four different designs on the wafer with 0.6 Gbytes/s.

A second embodiment uses EUV illumination and has a pixel grid of 12.5 nm on the wafer. It has 12 SLMs with 2560×8196 mirrors updated at 5 kHz. The data flow is 1258 Gbyte/s, the stage speed is 160 mm/s and one stripe takes 2 second to write. The buffer size if then 256 Gbytes, and the rasterizing capacity needed is 6.2 Gbytes/s for a single design.

While the preceding examples are cast in terms of a method, devices and systems employing this method are easily understood. A magnetic memory containing a program capable of practicing the claimed method is one such device. A computer system having memory loaded with a program practicing the claimed method is another such device.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method for patterning a workpiece covered at least partly with a layer sensitive to electromagnetic radiation, comprising the actions of:
   providing a data representation of at least one image to be imaged onto a plurality of locations of said workpiece,
   fracturing said data representation into a plurality of field stripes,
   repeating the actions of:
      rasterizing a first field stripe of said data representation,
      modulating a modulator according to said rasterized field stripe,
      imaging said first field stripe onto a plurality of locations of said workpiece,
      rasterizing a second field stripe of said data representation while imaging said first field stripe onto said plurality of locations of said workpiece,
   terminating the repetition when a predetermined amount of said image is imaged onto said plurality of locations of said workpiece.

2. The method according to claim 1, wherein said field stripes belonging to two consecutive strokes are non adjacent to each other.

3. The method according to claim 1, wherein said field stripes belonging to two consecutive strokes are adjacent to each other.

4. The method according to claim 1, wherein said image is imaged onto the workpiece by means of an SLM illuminated by said electromagnetic radiation.

5. The method according to claim 1, wherein said workpiece is a wafer.

6. The method according to claim 1, wherein said image represents an integrated circuit.

7. The method according to claim 1, wherein field stripes belonging to two consecutive strokes are imaged in opposing directions onto the workpiece.

8. A method for patterning a workpiece covered at least partly with a layer sensitive to electromagnetic radiation, comprising the actions of:
   providing a data representation of at least one image to be imaged onto a plurality of locations of said workpiece,
   fracturing said data representation into a plurality of field stripes,
   repeating the actions of:
      rasterizing a first field stripe of said data representation,
      modulating a modulator according to said rasterized field stripe,
      imaging said first field stripe onto a plurality of locations of said workpiece,
      rasterizing a second field stripe of said data representation while imaging said first field stripe onto said plurality of locations of said workpiece,
   terminating the repetition when a predetermined number of said images have been imaged onto said plurality of locations of said workpiece.

9. The method according to claim 8, wherein said field stripes belonging to two consecutive strokes are non adjacent to each other.

10. The method according to claim 8, wherein said field stripes belonging to two consecutive strokes are adjacent to each other.

11. The method according to claim 8, wherein said image is imaged onto the workpiece by means of an SLM illuminated by said electromagnetic radiation.

12. The method according to claim 8, wherein said workpiece is a wafer.

13. The method according to claim 8, wherein said image represents an integrated circuit.

14. The method according to claim 8, wherein field stripes belonging to two consecutive strokes are imaged in opposing directions onto the workpiece.

15. An apparatus for patterning a workpiece, comprising a memory for storing a data representation of at least one image to be written on said workpiece, a fracturing device to fracture said data representation into a plurality of field stripes, a rasterizing device to rasterize said field stripes, at least two buffer memories to buffer rasterized field stripes, a buffer write control to control into which buffer memory to write the rasterized data, a buffer read control to control from which buffer memory to read rasterized data to be imaged onto the workpiece, a scheduler to schedule which field stripe to rasterize, when to buffer rasterized data and when to read data to be imaged onto the workpiece, and a modulator capable to modulate a beam of electromagnetic radiation according to said rasterized data to be imaged onto a plurality of locations of said workpiece, wherein said apparatus is capable to rasterize a field stripe while imaging another field stripe onto said workpiece.

16. The method according to claim 15, wherein said workpiece is a wafer.

17. The method according to claim 15, wherein said image represents an integrated circuit.

18. The apparatus according to claim 15, wherein said image is imaged onto the workpiece by means of an SLM illuminated by said electromagnetic radiation.

* * * * *